(12) United States Patent
Salluzzo et al.

(10) Patent No.: US 11,327,525 B1
(45) Date of Patent: May 10, 2022

(54) CLOCK MONITORING UNIT WITH SERIAL CLOCK ROUTING PIPELINE

(71) Applicant: QUALCOMM Incorporated, San Diego, CA (US)

(72) Inventors: Federico Salluzzo, Cork (IE); Sina Dena, San Diego, CA (US); Amod Phadke, Bangalore (IN); Vanamali Bhat, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/127,513

(22) Filed: Dec. 18, 2020

(51) Int. Cl.
*G06F 1/04* (2006.01)
*G06F 1/14* (2006.01)
*H03L 7/095* (2006.01)
*G06F 1/08* (2006.01)
*B60R 16/02* (2006.01)

(52) U.S. Cl.
CPC ............... *G06F 1/14* (2013.01); *G06F 1/08* (2013.01); *H03L 7/095* (2013.01); *B60R 16/02* (2013.01)

(58) Field of Classification Search
CPC ... G06F 1/14; G06F 1/08; H03L 7/095; B60R 16/02
USPC ............................................. 327/291
See application file for complete search history.

(56) References Cited

U.S. PATENT DOCUMENTS

| | | | | |
|---|---|---|---|---|
| 6,665,367 B1 * | 12/2003 | Blair | ............... | G01R 31/31727 324/76.39 |
| 7,236,028 B1 * | 6/2007 | Choi | ............... | H03L 7/0814 327/158 |
| 7,242,223 B1 * | 7/2007 | Alon | ............... | G04D 7/1207 327/39 |
| 7,573,303 B1 * | 8/2009 | Chi | ............... | H03L 7/23 327/105 |
| 8,937,496 B1 * | 1/2015 | Ahmad | ............... | H03K 5/19 327/39 |
| 9,612,611 B1 * | 4/2017 | Nakibly | ............... | G06F 1/12 |
| 10,514,401 B2 * | 12/2019 | Duggal | ............... | G01R 23/10 |
| 11,074,207 B1 * | 7/2021 | Kim | ............... | B60R 16/023 |
| 2006/0273827 A1 * | 12/2006 | Kim | ............... | H03L 7/0814 327/2 |
| 2009/0135897 A1 * | 5/2009 | Soma | ............... | H03F 3/217 375/238 |
| 2010/0039157 A1 * | 2/2010 | Kaeriyama | ........... | H03L 7/0995 327/292 |
| 2016/0065215 A1 * | 3/2016 | Shin | ............... | H03L 7/18 327/45 |

(Continued)

OTHER PUBLICATIONS

International Search Report and Written Opinion—PCT/US2021/061884—ISA/EPO—dated Mar. 18, 2022.

*Primary Examiner* — Ryan Jager
(74) *Attorney, Agent, or Firm* — Loza & Loza, LLP

(57) ABSTRACT

An apparatus including a serial clock routing pipeline including a first set of clock inputs and a clock output; a first set of clock generators including a first set of clock outputs coupled to the first set of clock inputs of the serial clock routing pipeline, respectively; and a first clock monitoring unit including a first clock input coupled to the clock output of the serial clock routing pipeline, and a first status output to provide information concerning one or more of the first set of clock generators. The apparatus may further include a set of phase locked loops (PLLs) coupled to the set of clock generators, respectively; the set of PLLs also coupled to the clock monitoring unit.

31 Claims, 5 Drawing Sheets

(56) References Cited

U.S. PATENT DOCUMENTS

| | | |
|---|---|---|
| 2016/0259391 A1 | 9/2016 | Tidwell |
| 2016/0261251 A1 | 9/2016 | Tidwell |
| 2019/0041440 A1* | 2/2019 | Duggal .................. G01R 23/10 |
| 2019/0094902 A1 | 3/2019 | Kaneko |
| 2019/0114235 A1 | 4/2019 | Wojewoda et al. |
| 2020/0285737 A1* | 9/2020 | Kraus .................... G06F 21/552 |
| 2021/0264974 A1* | 8/2021 | Antonyan .......... G11C 13/0026 |

* cited by examiner

CLOCK MONITORING UNIT WITH SERIAL CLOCK ROUTING PIPELINE

FIELD

Aspects of the present disclosure relate generally to clock monitoring units, and in particular, to a clock monitoring unit with an associated serial clock routing pipeline.

DESCRIPTION OF RELATED ART

Vehicle or automotive control systems are typically subjected to more stringent electrical operational requirements. This is because errors in such vehicle or automotive control systems may result in severe injury and death to humans occupying associated vehicles, as well as humans, animals, and property that may collide with such vehicles. Such stringent electrical operational requirements typically deal with system redundancy, greater resistance to electrical and software faults, and improved monitoring of such systems, to name a few. One such subcomponent of such systems that is of interest herein are clock generators that produce timing signals, also commonly referred to as clock signals, or simply referred to as clocks to drive various signal processing cores of an integrated circuit (IC) or system on chip (SOC).

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a serial clock routing pipeline including a first set of clock inputs and a clock output; a first set of clock generators including a first set of clock outputs coupled to the first set of clock inputs of the serial clock routing pipeline, respectively; and a first clock monitoring unit including a first clock input coupled to the clock output of the serial clock routing pipeline, and a first status output to provide information concerning one or more of the first set of clock generators.

Another aspect of the disclosure relates to an apparatus. The apparatus includes a set of clock generators configured to generate a set of clocks, respectively; a clock monitoring unit configured to process the set of clocks, respectively; and a serial clock routing pipeline comprising a set of cascaded clock routing stages coupled to the set of clock generators, respectively, wherein the serial clock routing pipeline is configured to route a selected one of the set of clocks to the clock monitoring unit by way of one or more of the set of cascaded clock routing stages.

Another aspect of the disclosure relates to a method. The method includes generating a set of clocks; routing a selected one of the set of clocks for frequency measurement purpose via one or more cascaded clock routing stages of a serial clock routing pipeline; and determining the frequency of the selected clock after the selected clock has been routed through the serial clock routing pipeline.

Another aspect of the disclosure relates to a vehicle system. The vehicle system includes a vehicle control subsystem; a set of one or more digital signal processing cores coupled to the vehicle control subsystem; a serial clock routing pipeline including a set of clock inputs and a clock output; a set of clock generators including a set of clock outputs coupled to the first set of clock inputs of the serial clock routing pipeline, respectively, wherein the set of clock generators are coupled to the set of one or more digital signal processing cores; and a clock monitoring unit including a first clock input coupled to the clock output of the serial clock routing pipeline, and a first status output to provide information concerning one or more of the first set of clock generators.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Electronic circuits designed for vehicle or automotive control or other safety-related applications are typically prescribed with more stringent requirements. This is because faults in these circuits may result in severe injury and death to humans. There are governmental organizations that prescribe requirements for electronic circuits for automotive control and other safety-related applications, such as the International Organization for Standardization (ISO) and the International Electrotechnical Commission (IEC).

For example, the ISO has prescribed international standard ISO 26262 entitled "Road vehicles—Functional safety," which provides requirements for functional safety of electrical and/or electronic systems in serial production road vehicles. The IEC has prescribed an international standard IEC 61508 entitled "Functional Safety of Electrical/Electronic/Programmable Electronic Safety-related Systems," Road vehicles—Functional safety", which outlines methods on how to apply, design, deploy and maintain automatic protection systems called safety-related systems. In both ISO 26262 and IEC 61508, their specifications require that certain safety-related systems be continuously monitored during runtime in order to ensure proper operations of the safety-related items.

The continuously monitoring requirement also includes continuously monitoring clocks that drive data processing cores of an integrated circuit (IC) or system on chip (SOC) used in an automotive control or other safety-related systems. As used herein, "clocks," also commonly referred to as "clock signals," are timing signals that drive various operations in an IC or SoC, such as data processing, data transmission, etc. An IC or SOC may employ a clock monitoring unit (CMU) to measure the frequencies of the clocks and other related parameters, and provide interrupts to an Error Management Module (EMM) or a designated safety processor in the IC or SOC. These devices will then respond to the clock faults interrupts and take measures to ensure the automotive control or safety-related systems operate safely considering the nature and characteristics of the interrupts. Such clock faults may include clock frequency drifting due to phase locked loop (PLL) jitter, clock momentarily stopping, and PLL losing their lock.

Figure 1:
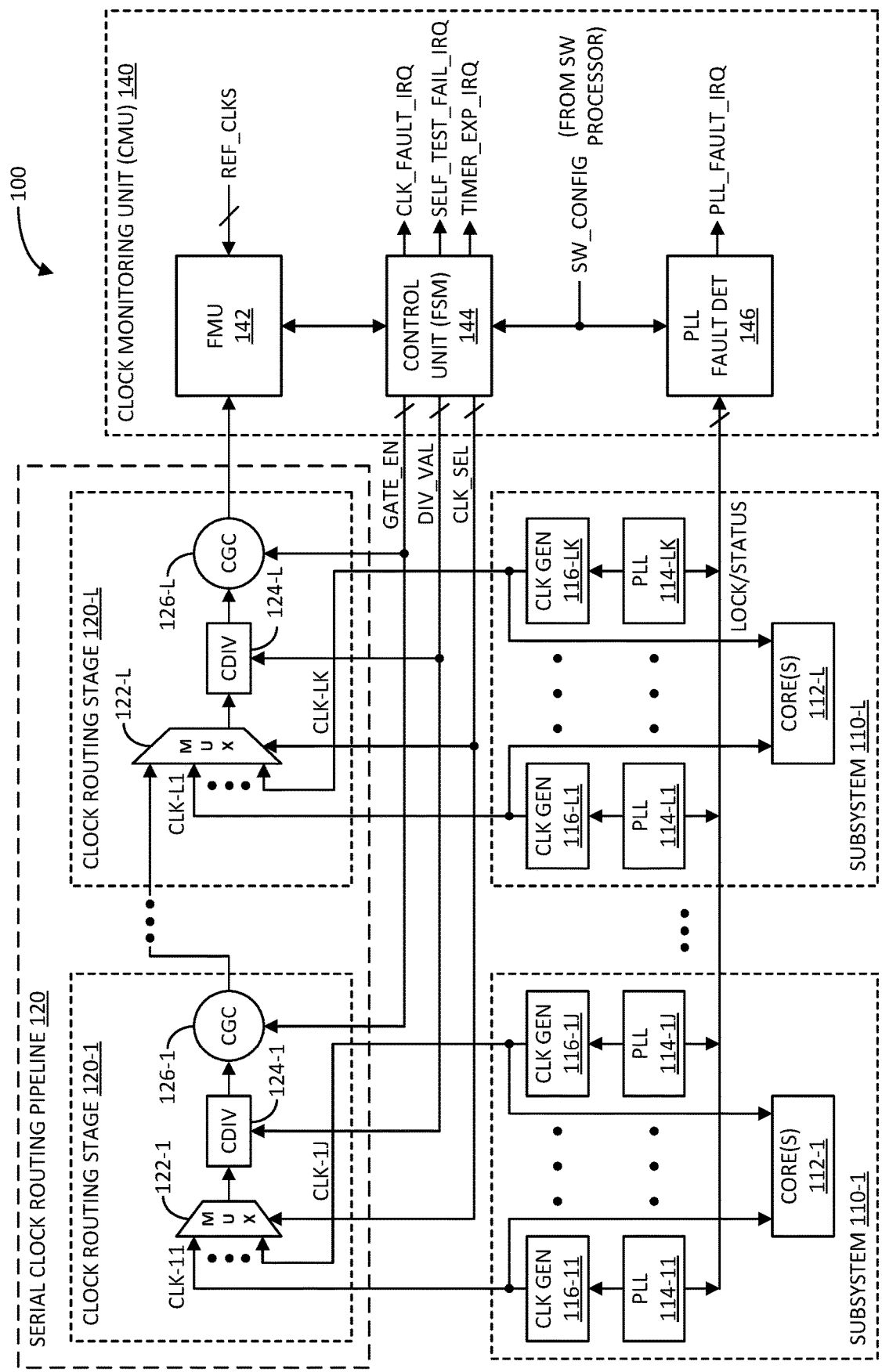
FIG. 1 illustrates a block diagram of an example integrated circuit (IC) or system on chip (SOC) in accordance with an aspect of the disclosure.

FIG. 1 illustrates a block diagram of an example integrated circuit (IC) or system on chip (SOC) 100 in accordance with an aspect of the disclosure. The IC or SOC 100 may be used in an automotive control system or other type of safety-related system. The IC 100 may include a set of subsystems 110-1 to 110-L to perform various operations in accordance with the design specification for the IC.

For example, in the case of automotive control, one or more of the set of subsystems 110-1 to 110-L may include semiautonomous or autonomous driving subsystems (e.g., Advanced Driver Assistance Systems (ADAS)), such as forward collision warning (FCW), lane departure warning (LWA), blind spot detection (BSD) subsystems (e.g., ADAS level "0" subsystems); adaptive cruise control (ACC) and lane keep assist (LKA) subsystems (e.g., ADAS level "1" subsystems); ACC with lane keeping and traffic jam assist subsystems (e.g., ADAS level "2" subsystems); highway autopilot and traffic jam pilot subsystems (e.g., ADAS level "3" subsystems); full highway autopilot and full urban autopilot subsystems (e.g., ADAS level "4" subsystems); and robo-taxi/shuttles and autonomous delivery fleets subsystems (e.g., ADAS level "5" subsystems).

The set of subsystems 110-1 to 110-L include a set of data processing cores 112-1 to 112-L, respectively. The set of data processing cores 112-1 to 112-L perform the data processing operations of the set of subsystems 110-1 to 110-L, respectively. The set of subsystems 110-1 to 110-L include a set of clock generators 116-11-116-1J to 116-L1-116-LK configured to generate subsystem clocks CLK-11-CLK-1J to CLK-L1-CLK-LK to drive the data processing operations of the set of data processing cores 112-1 to 112-L, respectively. Thus, the set of clock generators 116-11-116-1J to 116-L1-116-LK include clock outputs coupled to the set of data processing cores 112-1 to 112-L, respectively.

The set of subsystems 110-1 to 110-L include sets of phase locked loops (PLLs) PLL 114-11-114-1J to 114-L1-114-LK, respectively. The set of PLLs 114-11-114-1J to 114-L1-114-LK are configured to generate base clocks for the clock generators 116-11-116-1J to 116-L1-116-LK, respectively. The clock generators 116-11-116-1J to 116-L1-116-LK generate the subsystem clocks CLK-11-CLK-1J to CLK-L1-CLK-LK based on the base clocks generated by the PLLs 114-11-114-1J to 114-L1-114-LK, respectively.

Accordingly, the set of PLLs 114-11-114-1J to 114-L1-114-LK include clock outputs coupled to clock inputs of the clock generators 116-11-116-1J to 116-L1-116-LK, respectively.

The set of PLLs 114-11-114-1J to 114-L1-114-LK are configured to generate a set of PLL lock detect signals and a set of PLL status signals, respectively. The PLL lock detect signals indicate whether the corresponding PLLs are locked, and the PLL status signals indicate whether the corresponding lock detect signals are valid. For example, if upon startup of the IC 100 or the corresponding subsystems 110-1 to 110-L, the PLLs have yet to achieve lock and the corresponding PLL lock detect signals indicate out-of-lock states, the PLL status signals indicate that the corresponding PLL lock detect signals are not valid because the PLLs are starting up. Once the PLLs have locked after startup, the PLL status signals indicate that the PLL lock detect signals are valid. Thus, if the PLLs become out-of-lock thereafter, the PLL status signals indicate that the corresponding lock detect signals are valid; and thus, the lock detect signals indicate valid out-of-lock states.

The IC or SOC 100 further includes a serial clock routing pipeline 120. The serial clock routing pipeline 120 is configured to route a selected clock from one of the set of clock generators 16-11-116-1J to 116-L1-116-LK to a clock monitoring unit (CMU) 140 via one or more of a set of cascaded clock routing stages 120-1 to 120-L. The set of cascaded clock routing stages 120-1 to 120-L include a set of multiplexers (MUX) 122-1 to 122-L, a set of clock dividers (CDIV) 124-1 to 124-L, and a set of clock gating circuits (CGC) 126-1 to 126-L, respectively.

The set of multiplexers 122-1 to 122-L include sets of clock inputs coupled to the sets of clock outputs of the sets of clock generators 116-11-116-1J to 116-L1-16-LK, respectively. The set of multiplexers 122-1 to 122-L include clock outputs coupled to at least another clock input of at least a following one of the set of multiplexers 122-2 to 122-L to perform. This is done to implement the serial clock routing to the CMU 140. For example, the clock output of multiplexer 122-1 includes a clock output coupled to a clock input of the multiplexer 122-2 of the following clock routing stage 120-2 (not explicitly shown). Similarly, the clock output of multiplexer 122-L-1 of clock routing stage 120-L-1 (not explicitly shown) includes a clock output coupled to a clock input of the multiplexer 122-L of the following clock routing stage 120-L.

The set of multiplexers 122-1 to 122-L include a set of multiplexer select inputs configured to receive a clock select (CLK_SEL) signal from a set of clock select outputs of the CMU 140 to select the clock to be routed to the CMU 140 via the serial clock routing pipeline 120. For example, if the clock CLK-11 generated by clock generator 116-11 of subsystem 110-1 is selected for routing to the CMU 140 via the serial clock routing pipeline 120, the clock select (CLK_SEL) signal controls the multiplexer 122-1 to output the clock CLK-11 and the one or more other multiplexers 122-2 to 122-L to output the clock coming from the previous multiplexers 122-1 to 122-L-1, respectively. In this fashion, the selected clock CLK-11 is routed serially to the CMU 140 via clock routing stages 120-1 to 120-L.

The set of clock dividers 124-1 to 124-L include clock inputs coupled to the clock outputs of the set of multiplexers 122-1 to 122-L, respectively. The set of clock dividers 124-1 to 124-L include a set of clock divider value inputs configured to receive a divider value signal from a set of clock divider value outputs of the CMU 140 to control the frequency divider ratio N of the clock dividers 124-1 to 124-L, respectively. The frequency divider ratio N is the frequency of the input clock to a clock divider divided by the frequency of the output clock of the divider. The clock dividers 124-1 to 124-L are configured to frequency divide the selected clock so that the frequency of the clock provided to the CMU 140 is within a prescribed limit. For example, the prescribed frequency limit of the clock applied to the CMU 140 may be 200 megahertz (MHz). If, for example, the frequency of the selected clock CLK-11 is one (1) gigahertz (1 GHz), then the aggregate frequency division ratio of the clock dividers 124-1 to 124-L should be five (5) or more. As an example, the frequency divider ratio N of clock divider 124-1 may be set to five (5) and the frequency divider ratio(s) of the remaining clock dividers 124-2 to 124-L may be set to one (1) or bypassed.

The set of clock gating circuits (CGC) 126-1 to 126-L include clock inputs coupled to clock outputs of the set of clock dividers 124-1 to 124-L, respectively. The set of clock gating circuits 126-1 to 126-L include a set of clock gate enable inputs configured to receive a gate enable signal from a set of clock gate enable outputs of the CMU 140 to control the gating operation of the set of clock gating circuits (CGC) 126-1 to 126-L, respectively. For example, if the selected clock is CLK-11 generated by clock generator 116-11 for routing to the CMU 140, the gate enable signal is configured to control the set of clock gating circuits (CGC) 126-1 to 126-L to pass the selected clock CLK-11. If, for example, if the selected clock is CLK-LK generated by clock generator 116-LK for routing to the CMU 140, the gate enable signal is configured to control the set of clock gating circuits (CGC) 126-1 to 126-L−1 to block their respective input clocks so as not to unnecessarily consume clock power, and control to the clock gating circuit (CGC) 126-L to pass the selected clock CLK-LK to the CMU 140.

The CMU 140 includes a frequency measurement unit (FMU) 142, a control unit 144, which may be implemented using a finite state machine (FSM), and a PLL fault detector 146. The FMU 142 includes a clock input coupled to an output of the serial clock routing pipeline 120 (e.g., the clock output of the CGC 126-L). The FMU 142 includes at least one other clock input to receive a selected one of a set of reference clocks (REF_CLKS). The FMU 142 is configured to process the selected clock, or more specifically, measure a frequency of the selected clock based on the selected reference clock, and generate a value indicative of such frequency at a frequency measurement output coupled to an input of the control unit (FSM) 144. To process a signal, such as the selected clock, means to electrically respond to or manipulate the signal to generate a new signal or information related to the signal, such as an indication of the frequency of the signal if, for example, the signal is a clock.

The PLL fault detector 146 includes a set of PLL lock detect signal inputs and a set of PLL status signal inputs configured to receive the PLL lock detect signals and the PLL status signals from a set of PLL lock detect signal outputs and a set of PLL status signal outputs from the sets of PLLs 114-11-114-1J to PLLs 114-L1-114-LK, and generate a PLL fault interrupt request (IRQ) signal (PLL-_FAULT_IRQ) based on the PLL lock detect signals and the PLL status signals. For example, if PLL 114-1J is out-of-lock as indicated by the corresponding PLL lock detect signal, and the corresponding PLL status signal indicates that the corresponding PLL lock detect signal is valid, then the PLL fault detector 146 generates the PLL fault interrupt to identify PLL 114-1J whose PLL operation has lost its lock. It shall be understood that the PLL fault detector 146 may generate the PLL fault interrupt to indicate more than one PLL being out-of-lock. As previously discussed, if the corresponding PLL status signal indicates that the corresponding lock detect signal is not valid (e.g., during a startup condition), then the PLL fault detector does not generate the PLL fault interrupt based on that lock detect signal indicating an out-of-lock state.

The control unit (FSM) 144 is configured to control the operation of the frequency measurements of the clocks in accordance with a software (SW) configuration received from a SW configuration processor (not shown in FIG. 1). For example, for a particular measurement cycle, the SW configuration may provide the control unit (FSM) 144 information such as which clock(s) to measure, the corresponding clock divider value(s), and the corresponding clock gating circuit (CGC) states. In response to such SW configuration, the control unit (FSM) 144 generates the corresponding clock select (CLK_SEL), divider value (DIV-_VAL), and gate enable (GATE_EN) signals.

Additionally, for a particular measurement cycle, the SW configuration may also provide information as to the accuracy of the measurement of the frequencies of the selected clocks for the current measurement cycle. As discussed in more detail, this information may be in the form of a count limit (also referred to herein as a "downcount") that sets the number of clock edges (e.g., rising edges) of the selected reference clock to be used in the frequency measurement of each clock for the current measurement cycle. As suggested, the SW configuration may also identify the selected reference clock for the measurement. The SW configuration may also provide information as to what constitutes a clock fault or frequency specification, such as the target or expected frequency and the acceptable frequency margin for each clock. For example, if the measured frequency is within the expected frequency plus-or-minus the margin, no clock fault is detected with that clock. On the other hand, if the measured frequency is not within the expected frequency plus-or-minus the margin, a clock fault interrupt is generated.

The SW configuration may also instruct the control unit (FSM) 144 whether to perform a self-test of the reference clocks, the selection of the measured and reference clocks for the self-test, the accuracy (e.g., count limit or downcount) for the self-test, and information as to whether the measured reference clock is at fault (e.g., target frequency and margin). During a self-test, two (2) of the reference clocks (REF_CLKS) are provided to the FMU 142, where one of the reference clocks serves as the clock whose frequency is to be measured ("the measured clock") and the other reference clock serves as the reference clock for the measurement. The reference clock for the self-test may be selected to be the more frequency stable clock, and the measured clock for the self-test may be selected because it may be more appropriate for the clocks to be measured during a following measurement cycle. For example, if the measured reference frequency is within the expected frequency plus-or-minus the margin, no self-test fail is detected with that reference clock. On the other hand, if the measured frequency is not within the expected frequency plus-or-minus the margin, a self-test fail interrupt is generated.

The SW configuration may further provide information to the control unit (FSM) 144 as to a measurement time limit to complete the current clock measurement cycle. For example, if the time to perform the frequency measurement of the clocks identified in the current measurement cycle is less than or equal to the measurement time limit, no timer expiration interrupt is issued. On the other hand, if the time to perform the frequency measurement of the clocks identified in the current measurement cycle is greater than the measurement time limit, a timer expiration interrupt is issued. This may imply that the measurement of one or more clocks took longer than expected, and there may be an issue with one of the clocks, such as one of the clock generators temporarily halting the generation of the clock.

The SW configuration may also provide information to the control unit (FSM) 144 regarding continuing the measurement cycle. For example, the SW configuration may instruct the control unit (FSM) 144 to perform a single measurement cycle, and waits for further SW instruction to proceed to another measurement cycle. This is referred to herein as one-shot mode. The SW configuration may instruct the control unit (FSM) 144 to continuously perform measurement cycles in a loop. This is referred to herein as loop mode. The SW configuration may also provide information to the control unit (FSM) 144 as to whether or not to continue the measurement cycle if a clock fault is detected. For example, the SW configuration may assert a "continue" or "continue_on_fault" bit to cause the control unit (FSM) 144 to continue the measurement cycle even if a clock fault is detected. On the other hand, if the "continue" or "continue_on_fault" bit is not asserted, the control unit (FSM) 144 stops or halts the current measurement cycle, and requires SW intervention to restart it.

With regard to the PLL fault detector 146, the SW configuration may provide a PLL mask signal indicating which one or more PLL lock detect signal to mask to a PLL mask input of the PLL fault detector 146. In such case, the one or more PLL lock signal that are masked are ignored by the PLL fault detector 146. This means that if such masked PLL lock signal indicates an out-of-lock state, the PLL fault detector 146 ignores such indication.

As illustrated in FIG. 1, the control unit (FSM) 144 generates at a set of status outputs: a clock fault interrupt (CLK_FAULT_IRQ) in response to detecting a subsystem clock fault (a deviation of the frequency of a measured clock beyond the specified margin); generates a self-test fail interrupt (SELF_TEST_FAIL_IRQ) in response to a reference clock fault (a deviation of the frequency of a measured reference clock beyond the specified margin); and a timer expiration interrupt (TIMER_EXP_IRQ) in response to the time to complete a measurement cycle exceeding the measurement time limit. Similarly, the PLL fault detector 146 generates a PLL fault interrupt (PLL_FAULT_IRQ) in response to one or more of the unmasked PLL being out-of-lock as indicated by the corresponding one or more valid lock detect signals. The interrupts may be provided to an Error Management Module (EMM) or designated safety processor (not shown in FIG. 1) for providing an appropriate response to the interrupts to ensure human safety in accordance with the safety-related application.

Figure 2:
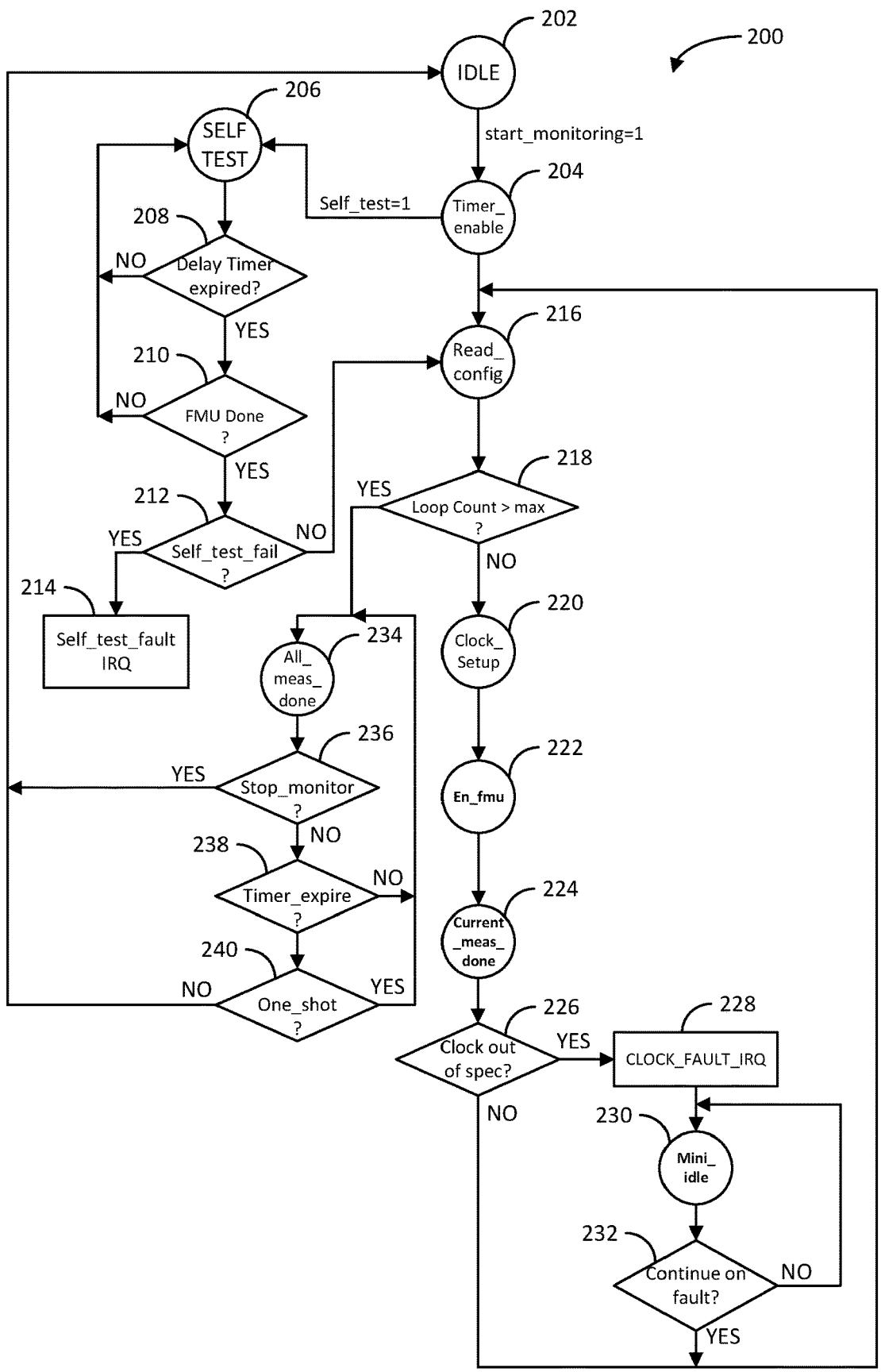
FIG. 2 illustrates a flow/state diagram of an example operation of a control unit finite state machine (FSM) of FIG. 1 in accordance with another aspect of the disclosure.

FIG. 2 illustrates a flow/state diagram related to an example method 200 of measuring frequencies of clocks and reporting faults performed by the control unit (FSM) 144 in accordance with another aspect of the disclosure. Initially, the control unit (FSM) 144 enters an idle state 202 in response to a reset signal, which also resets an associated timer for keeping track of the time elapsed during a current measurement cycle. In response to a start monitoring signal being asserted (e.g., start_monitoring=1) in a SW configuration register, the control unit (FSM) 144 enables the timer (timer-enable state 204). In the timer-enable state 204, the SW configuration processor clears the timer expiration interrupt (TIMER_EXP_IRQ) and the timer is started. Also, in the timer-enable state 204, the control unit (FSM) 144 also asserts a busy signal to indicate to the SW configuration processor that a clock frequency measurement has begun. Additionally, the control unit (FSM) 144 sets a loop counter to zero (0); the loop counter identifies the clock whose frequency is currently being measured during the measurement cycle.

At the timer-enable state 204, the control unit (FSM) 144 determines whether a self-test bit is asserted (Self_test=1) in the SW configuration register. If the control unit (FSM) 144 determines that the self-test signal is asserted, the control unit (FSM) 144 then enters a self-test state 206. As discussed, pursuant to the self-test, the control unit (FSM) 144 provides instructions and initiates the FMU 142 to perform a frequency measurement of a selected measured reference clock (frequency to be measured) based on a selected measuring reference clock (clock serving as the reference for the measurement). The selected measured reference clock is the one that will be used to measure the frequencies of the selected subsystem clocks pursuant to the current measurement cycle. During the self-test, the control unit (FSM) 144 determines whether a programmed delay timer has expired (block 208). The programmed delay is a time delay between initiating the FMU 142 and determining whether the FMU is done performing the reference clock frequency measurement. If the programmed delay timer has not expired, the control unit (FSM) 144 remains in the self-test state 206.

If the programmed delay time has expired, the control unit (FSM) 144 determines whether the FMU 142 has completed the frequency measurement (block 210). If the FMU 142 has not completed the reference clock frequency measurement, the control unit (FSM) 144 remains in the self-test state 206. If the control unit (FSM) 144 determines that the FMU 142 has completed the reference clock frequency measurement, the control unit (FSM) 144 determines whether the frequency of the selected measured reference clock is within specification (e.g., measured frequency is within target frequency±margin), i.e., whether a self_test_fail occurred (block 212). If the measured frequency is within specification (no self_test_fail), the control unit (FSM) 144 continues to a read configuration state 216 to being the frequency measurements of the selected subsystem clocks. If the measured frequency is not within specification (self_test_fail occurred), the control unit (FSM) 144 generates a self-test fail interrupt (SELF_TEST_FAIL_IRQ) (block 214). The control unit (FSM) 144 remains in the self-test state until the SW configuration processor asserts and deasserts the stop_monitoring signal, and brings the control unit (FSM) 144 back to the idle state 202. The SW configuration processor may subsequently clear the self-test fail interrupt.

Pursuant to the read configuration state 216, the control unit (FSM) 144 increments the loop count (e.g., loop count is set to one (1) when the read configuration state 216 is first reached) and reads the measurement configuration to determine whether the clock identified by the loop count is set for measurement. If it is not enabled for measurement, the control unit (FSM) 144 increments the loop count and determines again whether the clock identified by the loop count is enabled for measurement. The control unit (FSM) 144 continues this process until it determines a clock identified by the loop count that is enabled. In which case, the control unit (FSM) 144 determines whether the loop count is greater than the maximum number of clocks (block 218). If it is, all of the clocks pursuant to the current measurement cycle have been measured. If the loop count is not greater than the maximum, the control unit (FSM) 144 proceeds to a clock setup state 220.

Pursuant to the clock setup state 220, the control unit (FSM) 144 reads the SW configuration register to generate the clock select signal (CLK_SEL), the divider value (DIV_VAL) signal, and the gate enable signal (GATE_EN) to set up the serial clock routing pipeline 120 to route (and frequency divide) the clock identified by the current loop count to the FMU 142 for frequency measurement. Once the clock identified by the current loop count is routed to the FMU 142, the control unit (FSM) 144 waits a few clock cycles and then enables the FMU 142 to perform the frequency measurement (En_fmu state 222). The control unit (FSM) 144 then determines whether the frequency of the clock identified by the current loop count is within specification (block 226).

If the measured frequency is within specification, the control unit (FSM) 144 proceeds to the read configuration state 216 to increment the loop count and determine whether the clock identified by the loop count is enabled for measurement based on the current SW configuration, as previously discussed. If the measured frequency is not within specification, the control unit (FSM) 144 generates a clock fault interrupt (CLOCK_FAULT_IRQ) (block 228). The control unit (FSM) 144 then enters a mini-idle state 230, where it stops the timer and deasserts the busy signal. The control unit (FSM) 144 also determines whether a continue_on_fault bit in the SW configuration registers is asserted (block 232). If the continue_on_fault bit is asserted, the control unit (FSM) 144 proceeds to the read configuration state 216 to increment the loop count and determine whether the clock identified by the loop count is enabled for measurement based on the current SW configuration, as previously discussed. If the continue_on_fault bit is not asserted, the control unit (FSM) 144 remains in the mini-idle state 230, and waits for SW intervention.

If in block 218, the control unit (FSM) 144 determines that the loop count is greater than the maximum, the control unit (FSM) 144 proceeds to the All_measurement_done state 234, where it asserts the done signal. The control unit (FSM) 144 then determines whether the stop monitoring signal is asserted (block 236). If it is, the control unit (FSM) 144 proceeds back to the idle state 202. If the stop monitoring signal is not asserted, the control unit (FSM) 144 determines whether the timer has expired (block 238). If it has not, the control unit (FSM) 144 returns back to the All_measurement_done state 234. If the timer has expired, the control unit (FSM) 144 determines whether the one_shot signal is asserted in the SW configuration register (block 240). If it is not, the control unit (FSM) 144 proceeds back to the idle state 202. If the one_shot signal is asserted, the control unit (FSM) 144 returns back to the All_measurement_done state 234. In such case, the SW processor needs to clear any generated interrupt, and assert and deassert the stop monitoring bit to return the control unit (FSM) 144 to the idle state 202.

Figure 3:
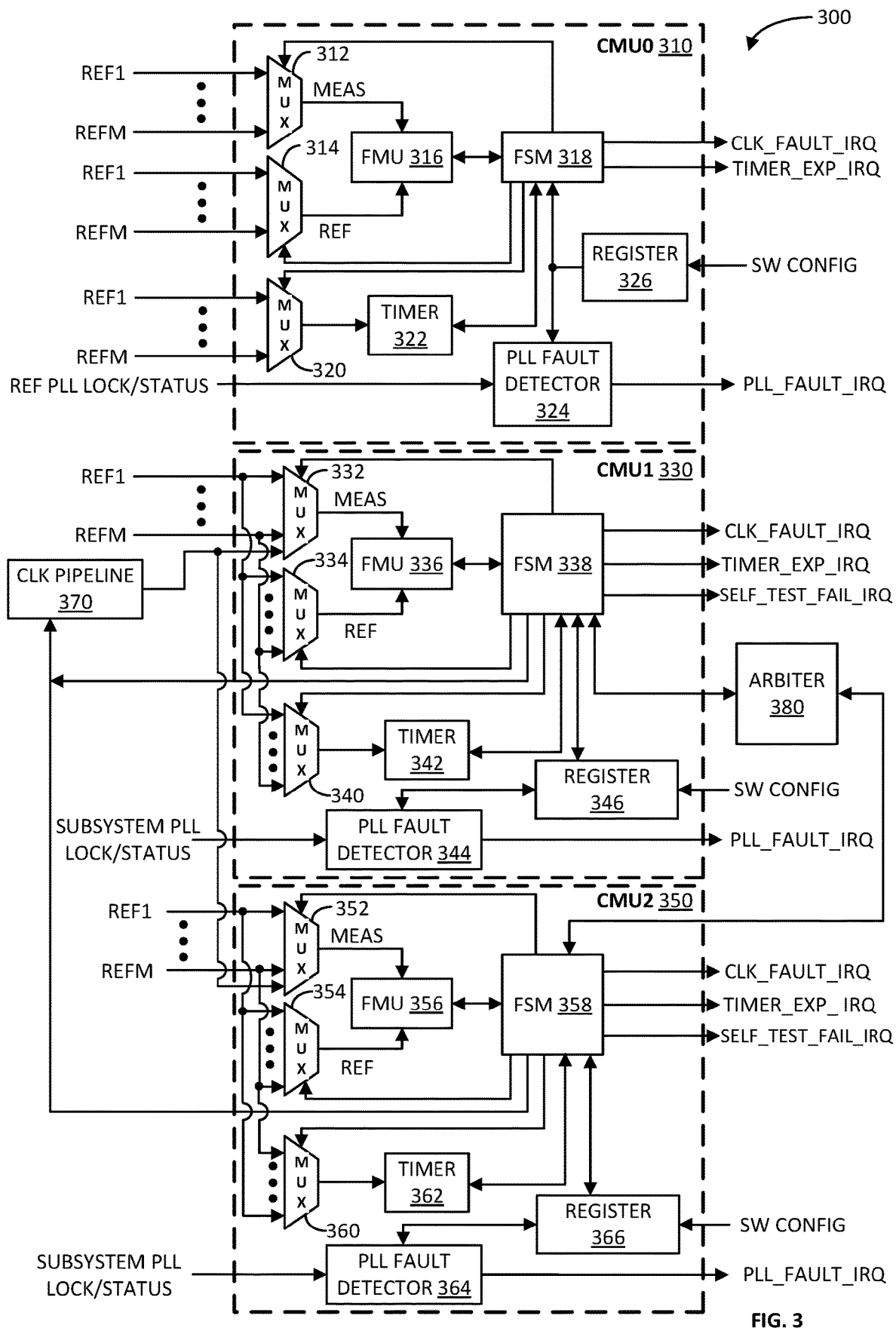
FIG. 3 illustrates a block diagram of another example clock monitoring system in accordance with another aspect of the disclosure.

FIG. 3 illustrates a block diagram of an example clock monitoring system 300 in accordance with another aspect of the disclosure. The clock monitoring system 300 includes three (3) clock monitoring units (CMUs) 310, 330, and 350.

The CMU0 310 may be configured to (continuously or non-continuously) measure the frequency of a selected reference clock based on another selected reference clock. The CMUs 330 and 350 are each configured to measure the frequency of one or more selected subsystem clocks using a selected reference clock. The CMUs 330 and 350 may be configured to run different measurements based on different SW configurations, or may be configured to run the same measurement based on the same SW configuration for redundancy purposes. The CMUs 330 and 350 may be operated one at a time, and the clock monitoring system 300 may include an arbiter 380 to control which CMU 330 or 350 is active at a particular time.

More specifically, the CMU0 310 includes a first multiplexer 312, a second multiplexer 314, a third multiplexer 320, a frequency measurement unit (FMU) 316, a control unit (finite state machine (FSM)) 318, a timer 322, a phase locked loop (PLL) fault detector 324, and a software (SW) configuration register 326. The first multiplexer 312 includes a set of inputs to receive a set of reference clocks REF1 to REFM, respectively. Similarly, the second multiplexer 314 includes a set of inputs to receive the set of reference clocks REF1 to REFM, respectively. Likewise, the third multiplexer 320 includes a set of inputs to receive the set of reference clocks REF1 to REFM, respectively. The first, second, and third multiplexers 312, 314, and 320 include select inputs coupled to outputs of the control unit (FSM) 318, respectively. The first and second multiplexers 312 and 314 include outputs coupled to inputs of the FMU 316, respectively. The third multiplexer 320 includes an output coupled to an input of the timer 322.

The control unit (FSM) 318 is coupled to the FMU 316. The FSM 318 includes outputs to produce a clock fault interrupt (CLK_FAULT_IRQ) and a timer expire interrupt (TIMER_EXP_IRQ). The timer 322 is coupled to the FSM 318. The PLL fault detector 324 includes an input to receive a set of reference PLL lock detect and status signals associated with the set of reference clocks REF1 to REFM, respectively. That is, the set of PLLs that generate base clock signals for the set of reference clocks REF1 to REFM are configured to generate the set of reference PLL lock detect and status signals, respectively. The PLL fault detector 324 includes an output to produce a PLL fault interrupt (PLL_FAULT_IRQ). The SW configuration register 326 includes an input to receive a SW configuration from a SW configuration processor (not shown in FIG. 3). The SW configuration register 326 is coupled to the FSM 318 and PLL fault detector 324.

As discussed, the CMU0 310 may be configured to measure the frequency of a selected measured reference clock using a selected measuring reference clock. In this regard, the SW configuration processor provides the SW configuration register 326 with the measurement configuration. The measurement configuration may include: (1) the reference clock whose frequency is to be measured ("MEAS"); (2) the reference clock on which the frequency measurement is based ("REF"); (3) the accuracy or resolution of the measurement in terms of periods of the "REF" clock (e.g., the count limit or downcount); (4) the specification for the frequency (e.g., target frequency and margin); (5) the reference clock selected for the timer 322; (6) a measurement time limit by which the measurement should be completed (e.g., in terms of periods of the reference clock selected for the timer 322); (7) whether the measurement is to be performed continuous in a loop or as a one-shot; (8) whether the measurement should stop or continue upon detecting a fault; and (9) which, if any, one or more of the PLL lock detect/status signals are masked or ignored.

Based on the SW configuration stored in the register 326, the control unit (FSM) 318: (1) sends a select signal to the select input of the first multiplexer 312 so that the reference clock whose frequency is to be measured ("MEAS") is provided to the FMU 316; (2) sends a select signal to the select input of the second multiplexer 314 so that the reference clock on which the frequency measurement is based ("REF") is provided to the FMU 316; (3) sends the FMU 316 the count limit or downcount to set the accuracy or resolution of the frequency measurement; (4) receives the frequency measurement (upcount) from the FMU 316, compares the frequency measurement to the specification (target frequency±margin), and generate a clock fault interrupt (CLK_FAULT_IRQ) if the frequency measurement is out-of-specification; (5) sends a select signal to the select input of the third multiplexer 320 so that the selected timer reference clock is provided to the timer 322; (6) sends the timer 322 the measurement time limit, receives an indication from the timer 322 whether the timer has expired, and generates a timer expiration interrupt (TIMER_EXP_IRQ) if the frequency measurement of the all the clocks per the current measurement cycle has not completed before the expiration of the timer; (7) repeatedly initiates the timer 322 for additional frequency measurements if the measurement is to be performed continuous in a loop, or stops if the measurement is performed as a one-shot; and (8) determines whether to stop or continue the frequency measurement in response to detecting a clock fault.

Based on the SW configuration stored in the register 326, the PLL fault detector 324 generates a PLL fault interrupt (PLL_FAULT_IRQ) in response to one or more valid and unmasked reference PLL lock detect signal(s) indicating the corresponding PLL(s) being out-of-lock. As discussed, the PLL fault detector 324 may ignore reference PLL lock detect signals that are masked as indicated by the current SW configuration stored in the register 326.

The CMU1 330 includes a first multiplexer 332, a second multiplexer 334, a third multiplexer 340, a frequency measurement unit (FMU) 336, a control unit (finite state machine (FSM)) 338, a timer 342, a phase locked loop (PLL) fault detector 344, and a software (SW) configuration register 346. The first multiplexer 332 includes a set of inputs to receive the set of reference clocks REF1 to REFM and a selected subsystem clock from an output of a serial clock routing pipeline 370, respectively. The serial clock routing pipeline 370 may be configured similar to serial clock routing pipeline 120 previously discussed. The second multiplexer 334 includes a set of inputs to receive the set of reference clocks REF1 to REFM, respectively. Similarly, the third multiplexer 340 includes a set of inputs to receive the set of reference clocks REF1 to REFM, respectively. The first, second, and third multiplexers 332, 334, and 340 include select inputs coupled to outputs of the control unit (FSM) 338, respectively. The first and second multiplexers 332 and 334 include outputs coupled to inputs of the FMU 336, respectively. The third multiplexer 340 includes an output coupled to an input of the timer 342.

The control unit (FSM) 338 is coupled to the FMU 336. The FSM 338 includes outputs to produce a clock fault interrupt (CLK_FAULT_IRQ), a timer expiration interrupt (TIMER_EXP_IRQ), and a self-test fail interrupt (SELF_TEST_FAIL_IRQ). The timer 342 is coupled to the FSM 338. The PLL fault detector 344 includes an input to receive a set of subsystem PLL lock detect and status signals associated with the set of subsystem clocks CLK-11 to CLK-LK, respectively. That is, the set of PLLs 114-11 TO 114-LK that generate base clock signals for the set of clock generators 116-11 to 116-LK are configured to generate the set of reference PLL lock detect and status signals, respectively. The PLL fault detector 344 includes an output to produce a PLL fault interrupt (PLL_FAULT_IRQ). The SW configuration register 346 includes an input to receive a SW configuration from the SW configuration processor (not shown in FIG. 3). The SW configuration register 346 is coupled to the FSM 338 and PLL fault detector 344.

Based on the current SW configuration stored in the register 346, the CMU1 330 may be configured to measure the frequency of a selected measured reference clock using a selected measuring reference clock in a self-test mode, and/or measure the frequency of a selected subsystem clock using a selected measuring reference clock in a measurement mode. In this regard, the SW configuration processor provides the SW configuration register 346 with the measurement configuration. The SW measurement configuration may include: (1) whether a self-test is to be performed; (2) the reference clock whose frequency is to be measured ("MEAS") in the self-test mode; (3) the subsystem clock whose frequency is to be measured ("MEAS") in the measurement mode; (4) the reference clock on which the frequency measurement is based ("REF"); (5) the accuracy or resolution of the measurement in terms of periods of the "REF" clock (e.g., the count limit or downcount); (6) the specification for the frequency (e.g., target frequency and margin); (7) the reference clock selected for the timer 342; (8) a measurement time limit by which the measurement should be completed (e.g., in terms of periods of the reference clock selected for the timer 342); (9) whether the measurement is to be performed continuous in a loop or as a one-shot; (10) whether the measurement should stop or continue upon detecting a fault; and (11) which, if any, one or more of the PLL lock detect/status signals are masked or ignored.

Based on the current SW configuration stored in the register 346, the control unit (FSM) 338: (1) sends a select signal to the select input of the first multiplexer 332 so that the reference clock whose frequency is to be measured ("MEAS") is provided to the FMU 336 in self-test mode; (2) sends control signals (CLK_SEL, DIV_VAL, GATE_EN) to the serial clock routing pipeline 370 to route a selected subsystem clock with the selected frequency division to the input of the first multiplexer 332 in measurement mode; (3) sends a select signal to the select input of the first multiplexer 332 so that the subsystem clock outputted by the serial clock routing pipeline 370 ("MEAS") is provided to the FMU 336 for frequency measurement in measurement mode; (4) sends a select signal to the select input of the second multiplexer 334 so that the reference clock on which the frequency measurement is based ("REF") is provided to the FMU 336; (5) sends the FMU 336 the count limit or downcount to set the accuracy or resolution of the frequency measurement; (6) receives the frequency measurement (upcount) from the FMU 336, compares the frequency measurement to the specification (target frequency±margin), and generates an interrupt (SELF_TEST_FAIL_IRQ if in self-test mode or CLK_FAULT_IRQ if in measurement mode) if the frequency measurement is out-of-specification; (7) sends a select signal to the select input of the third multiplexer 340 so that the selected timer reference clock is provided to the timer 342; (8) sends the timer 342 the measurement time limit, receives an indication from the timer 342 whether the timer has expired, and generates a timer fault interrupt (TIMER_EXP_IRQ) if the frequency measurement of the selected clock ("MEAS") has not completed before the expiration of the timer; (9) repeatedly initiates the timer 342 for additional frequency measurements if the measurement is to be performed continuous in a loop, or stops if the measurement is performed as a one-shot; and (10) determines whether to stop or continue the frequency measurement in response to detecting a clock fault.

Based on the SW configuration stored in the register 346, the PLL fault detector 344 generates a PLL fault interrupt (PLL_FAULT_IRQ) in response to one or more valid and unmasked subsystem PLL lock detect signals indicating the corresponding PLL(s) being out-of-lock. As discussed, the PLL fault detector 344 may ignore reference PLL lock detect signals that are masked as indicated by the current SW configuration stored in the register 346.

The CMU2 350 includes a first multiplexer 352, a second multiplexer 354, a third multiplexer 360, a frequency measurement unit (FMU) 356, a control unit (finite state machine (FSM)) 358, a timer 362, a phase locked loop (PLL) fault detector 364, and a software (SW) configuration register 366. The first multiplexer 352 includes a set of inputs to receive the set of reference clocks REF1 to REFM and a selected subsystem clock from the output of the serial clock routing pipeline 370, respectively. The second multiplexer 354 includes a set of inputs to receive the set of reference clocks REF1 to REFM, respectively. Similarly, the third multiplexer 360 includes a set of inputs to receive the set of reference clocks REF1 to REFM, respectively. The first, second, and third multiplexers 352, 354, and 360 include select inputs coupled to outputs of the control unit (FSM) 358, respectively. The first and second multiplexers 352 and 354 include outputs coupled to inputs of the FMU 356, respectively. The third multiplexer 360 includes an output coupled to an input of the timer 362.

The control unit (FSM) 358 is coupled to the FMU 356. The FSM 358 includes outputs to produce a clock fault interrupt (CLK_FAULT_IRQ), a timer expiration interrupt (TIMER_EXP_IRQ), and a self-test fail interrupt (SELF_TEST_FAIL_IRQ). The timer 362 is coupled to the FSM 358. The PLL fault detector 364 includes an input to receive a set of subsystem PLL lock detect and status signals associated with the set of subsystem clocks CLK-11 to CLK-LK, respectively. That is, the set of PLLs 114-11 TO 114-LK that generate base clock signals for the set of clock generators 116-11 to 116-LK are configured to generate the set of reference PLL lock detect and status signals, respectively. The PLL fault detector 364 includes an output to produce a PLL fault interrupt (PLL_FAULT_IRQ). The SW configuration register 366 includes an input to receive a SW configuration from the SW configuration processor. The SW configuration register 366 is coupled to the FSM 358 and PLL fault detector 364.

Based on the current SW configuration, the CMU2 350 may be configured to measure the frequency of a selected measured reference clock using a selected measuring reference clock in a self-test mode, and/or measure the frequency of a selected subsystem clock using a selected reference clock in measurement mode. In this regard, the SW processor provides the SW configuration register 366 with the measurement configuration. The SW measurement configuration may include: (1) whether a self-test is to be performed; (2) the reference clock whose frequency is to be measured ("MEAS") in the self-test mode; (3) the subsystem clock whose frequency is to be measured ("MEAS") in the measurement mode; (4) the reference clock on which the frequency measurement is based ("REF"); (5) the accuracy or resolution of the measurement in terms of periods of the "REF" clock (e.g., the count limit or downcount); (6) the specification for the frequency (e.g., target frequency and margin); (7) the reference clock selected for the timer 362; (8) a measurement time limit by which the measurement should be completed (e.g., in terms of periods of the reference clock selected for the timer 362); (9) whether the measurement is to be performed continuous in a loop or as a one-shot; (10) whether the measurement should stop or continue upon detecting a fault; and (11) which one or more of the PLL lock detect/status signals are masked or ignored.

Based on the current SW configuration stored in the register 366, the control unit (FSM) 358: (1) sends a select signal to the select input of the first multiplexer 352 so that the reference clock whose frequency is to be measured ("MEAS") is provided to the FMU 356 in self-test mode; (2) sends control signals (CLK_SEL, DIV_VAL, GATE_EN) to the serial clock routing pipeline 370 to route a selected subsystem clock with the selected frequency division to the input of the first multiplexer 352 in measurement mode; (3) sends a select signal to the select input of the first multiplexer 352 so that the subsystem clock outputted by the serial clock routing pipeline 370 ("MEAS") is provided to the FMU 356 for frequency measurement in measurement mode; (4) sends a select signal to the select input of the second multiplexer 354 so that the reference clock on which the frequency measurement is based ("REF") is provided to the FMU 356; (5) sends the FMU 356 the count limit or downcount to set the accuracy or resolution of the frequency measurement; (6) receives the frequency measurement (upcount) from the FMU 356, compares the frequency measurement to the specification (target frequency±margin), and generates a clock fault interrupt (SELF_TEST_FAIL_IRQ if in self-test mode or CLK_FAULT_IRQ if in measurement mode) if the frequency measurement is out-of-specification; (7) sends a select signal to the select input of the third multiplexer 360 so that the selected timer reference clock is provided to the timer 362; (8) sends the timer 362 the measurement time limit, receives an indication from the timer 362 whether the timer has expired, and generates a timer expire interrupt (TIMER_EXP_IRQ) if the frequency measurement of the selected clock ("MEAS") has not completed before the expiration of the timer; (9) repeatedly initiates the timer 36 for additional frequency measurements if the measurement is to be performed continuous in a loop, or stops if the measurement is performed as a one-shot; and (10) determines whether to stop or continue the frequency measurement in response to detecting a clock fault.

Based on the SW configuration stored in the register 366, the PLL fault detector 364 generates a PLL fault interrupt (PLL_FAULT_IRQ) in response to one or more valid and unmasked subsystem PLL lock detect signals indicating the corresponding PLL(s) being out-of-lock. As discussed, the PLL fault detector 364 may ignore reference PLL lock detect signals that are masked as indicated by the current SW configuration stored in the register 366.

The CMU1 330 and the CMU2 350 may be operated in extended mode or redundancy mode. In extended mode, the CMU1 330 and CMU2 350 perform different measurements based on different configurations stored in their respective registers 346 and 366, respectively. For example, the CMU1 330 may be configured to perform clock frequency measurements and PLL out-of-lock detection related to subsystem clocks CLK-11 to CLK-1J generated within subsystem 110-1, and the CMU2 350 may be configured to perform subsystem clock frequency measurements and PLL out-of-lock detection related to clocks CLK-L1 to CLK-LK generated within subsystem 110-L. It shall be understood that the measurement configurations in registers 346 and 366 may be different in other manners in extended mode. In redundancy mode, the CMU1 330 and CMU2 350 perform the same measurements based on the same configurations stored in their respective registers 346 and 366, respectively. It shall also be understood that the CMU1 330 may be operated alone, while the CMU2 350 is inactive. Similarly, the CMU2 350 may be operated alone, while the CMU1 330 is inactive.

Additionally, the CMU1 330 and CMU2 350 may be operated such that only one is active at a particular time. This may be because, in this example, the serial clock routing pipeline 370 is common to both CMU1 330 and CMU2 350. In this regard, the arbiter 380 controls which of the CMUs 330 and 350 is active at a particular time. For example, at time $t_1$, the arbiter 380 asserts the start_monitoring bit for CMU1 330, while it deasserts the start_monitoring bit for CMU2 350. This causes the CMU1 330 to be active and the CMU2 350 to be inactive between time $t_1$ and time $t_2$, when the CMU1 330 asserts its All_measurement_done bit. In response to the asserted All_measurement_done bit from CMU1 330, at time t3 the arbiter 380 asserts the start_monitoring bit for CMU2 350, while it deasserts the start_monitoring bit for CMU1 330. This causes the CMU2 350 to be active and the CMU1 330 to be inactive between time t3 and time t4, when the CMU2 350 asserts its All_measurement_done bit. This process continuous; thereby, toggling the active/inactive states of CMU1 330 and CMU2 350.

Figure 4:
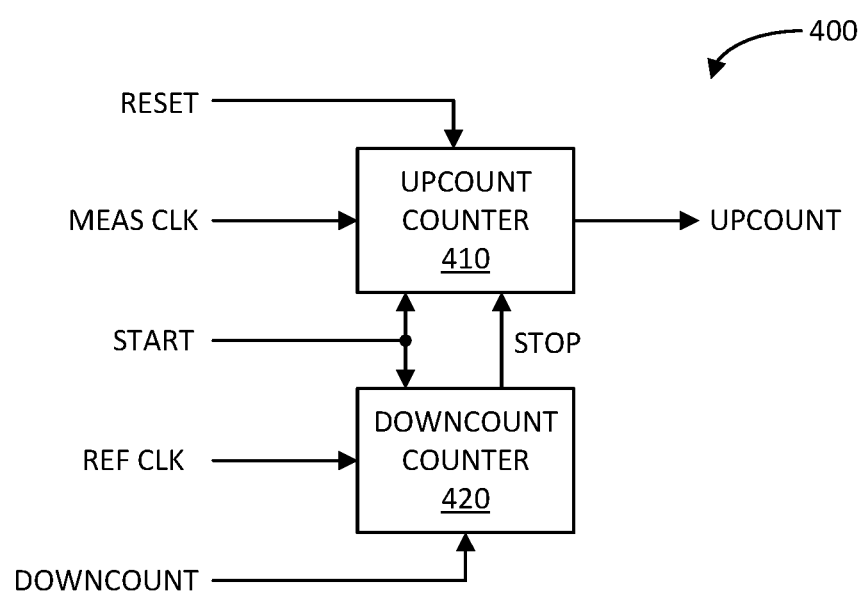
FIG. 4 illustrates a block diagram of an example frequency measurement unit (FMU) in accordance with another aspect of the disclosure.

FIG. 4 illustrates a block diagram of an example frequency measurement unit (FMU) 400 in accordance with another aspect of the disclosure. The FMU 400 may be an example detailed implementation of any of the FMUs 142, 316, 336, and 356 previously discussed.

The FMU 400 includes an upcount counter 410 and a downcount counter 420. The upcount counter 410 includes a reset input to receive a reset signal, a measured clock input to receive the measured clock (the clock whose frequency is to be measured), a start input to receive a start signal, and a stop input to receive a stop signal. The reset and start signals may be received from a control output of a control unit (FSM), such as control unit (FSM) 144, 318, 338, and 358. The upcount counter 410 includes a frequency measurement output to produce an upcount signal, which is a measurement of the frequency of the measured clock. The upcount signal may be provided to a control unit (FSM), such as control unit (FSM) 144, 318, 338, and 358.

The downcount counter 420 includes a start input to receive the start signal, a reference clock input to receive the reference clock (the clock on which the frequency measurement is based), and a count limit input to receive a count limit or downcount. As discussed, the downcount signal, in addition to the start signal, may be received from the control output of a control unit (FSM), such as control unit (FSM) 144, 318, 338, and 358. The downcount counter 420 includes an output to produce the stop signal.

In operation, the count limit or downcount initializes the downcount counter 420 to an initial "downcount" value. The reset signal initializes the upcount counter 410 to zero (0). In response to an assertion of the start signal, the downcount counter 420 decreases its count from the initial downcount value by one (1) for each clock (rising) edge of the reference clock, and the upcount counter 410 increases its count from its initial value of zero (0) by one (1) for each clock (rising) edge of the measured clock. It shall be understood that the counters 410 and 420 may count in response to the falling edges of the measured and reference clocks, respectively.

When the count of the downcount counter 420 reaches zero (0), the downcount counter 420 asserts the stop signal. In response to the asserted stop signal, the upcount counter 410 stops counting, and the upcount value, at such time, is a measurement of the frequency of the measured clock. The accuracy of the upcount value is directly related to the frequency of the reference clock and the downcount value, which may be set by the SW configuration processor per the SW configuration.

Figure 5:
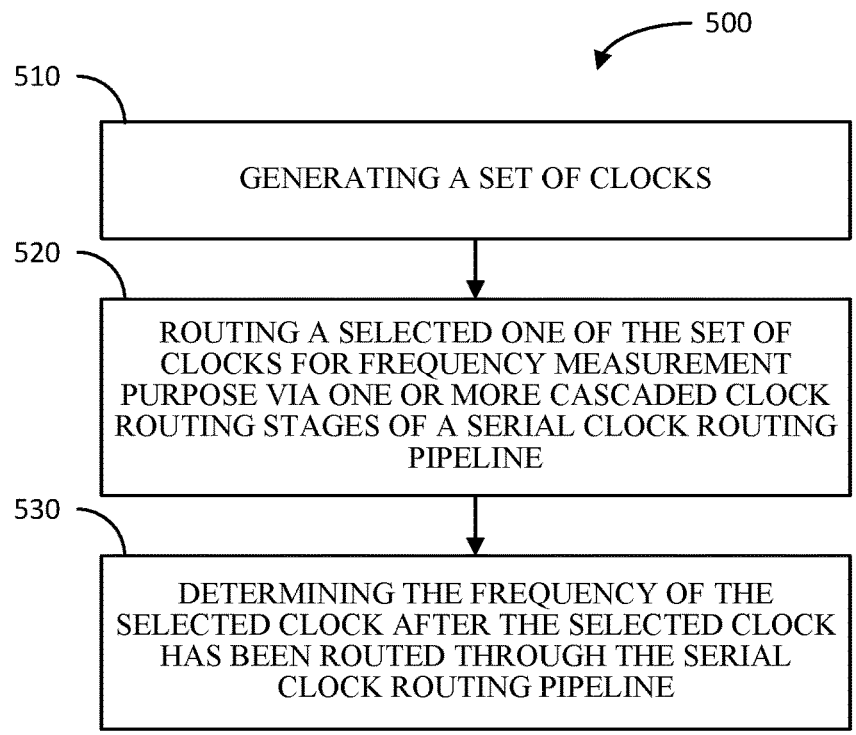
FIG. 5 illustrates a flow diagram of an example method of measuring a frequency of a selected clock in accordance with another aspect of the disclosure.

FIG. 5 illustrates a flow diagram of an example method 500 of measuring a frequency of a selected clock in accordance with another aspect of the disclosure. The method 500 includes generating a set of clocks (block 510). The method 500 further includes routing a selected one of the set of clocks for frequency measurement purpose via one or more cascaded clock routing stages of a serial clock routing pipeline (block 520). Additionally, the method 500 includes determining the frequency of the selected clock after the selected clock has been routed through the serial clock routing pipeline (block 530).

Figure 6:
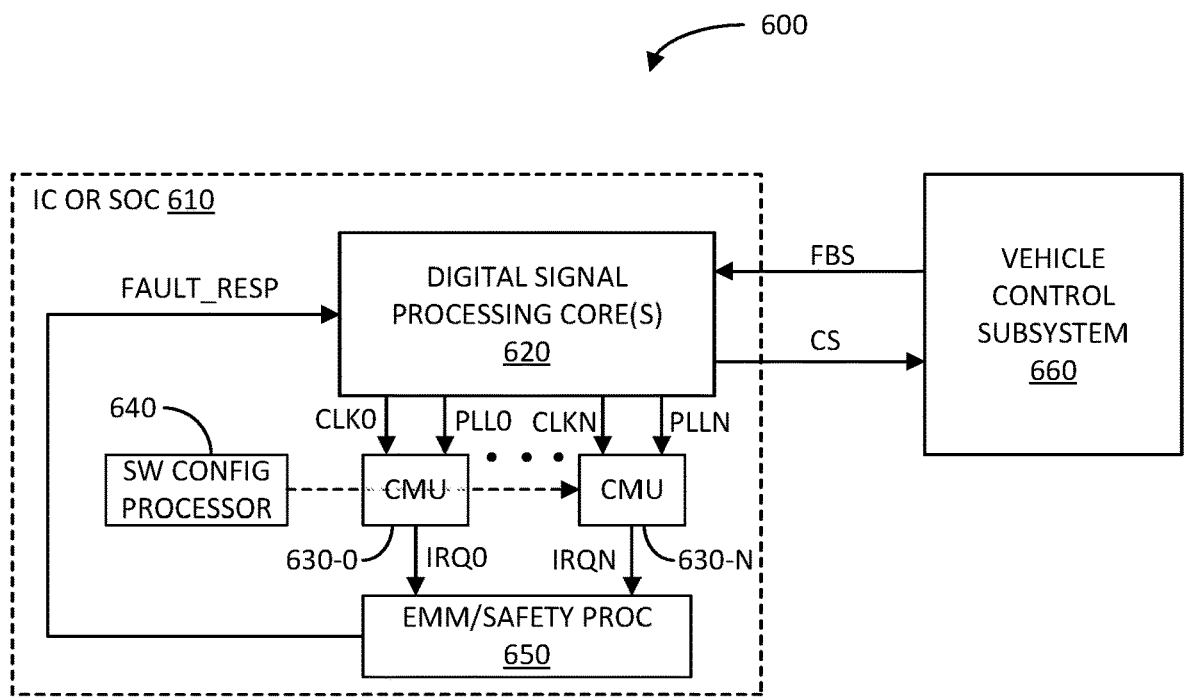
FIG. 6 illustrates a block diagram of an example vehicle system in accordance with another aspect of the disclosure.

FIG. 6 illustrates a block diagram of an example vehicle system 600 in accordance with another aspect of the disclosure. In this example, the vehicle system 600 pertains to an automotive system, but it shall be understood that other types of systems may employ clock monitoring systems as described herein.

The vehicle system 600 includes an integrated circuit (IC) 610, which may be configured as a system on chip (SOC). The IC 610 includes a set of one or more digital signal processing cores 620, which, in turn, includes a set of clock generators driven by a set of PLLs. The set of clock generators generate clocks CLK0 to CLKN for driving the data processing operation of the set of one or more digital signal processing cores 620.

The IC 610 further includes a set of one or more clock monitoring units CMU 630-0 to CMU 630-N configured to receive the set of clocks CLK0 to CLKN, for example, via a serial clock routing pipeline as discussed. The set of one or more clock monitoring units CMU 630-0 to CMU 630-N are also configured to receive PLL lock detect/status signals PLL0 to PLLN from the set of PLLs, respectively. Each of the CMUs 630-0 to CMU 630-N may be configured per any of the CMUs 140, 310, 330, and 350 previously discussed. The IC 610 further includes a software (SW) configuration processor 640 to configure the set of the CMUs 630-0 to 630-N as previously discussed. The set of CMUs 630-0 to 630-N are configured to generate a set of interrupts IRQ0 to IRQN if any clock faults, PLL faults, timer expiration faults, and/or self-test faults are detected as previously discussed.

The IC 610 further includes an error management module (EMM) or safety processor 650 configured to receive one or more of the set of interrupts IRQ0 to IRQN if the corresponding one or more faults are detected by the set of CMUs 630-0 and 630-N. The EMM 650 generates a fault response (FAULT_RESP) based on the one or more of the set of interrupts IRQ0 to IRQN received. The fault response is provided to the set of digital signal processing cores 620, which perform any prescribed function(s) in response to the fault response. For example, the digital signal processing cores 620 may generate one or more warnings to the operator (driver) associated with the vehicle system 600, and/or disable any one or more components of a vehicle control subsystem 660, and/or activate some components and/or deactivate other components of the vehicle control subsystem 660, etc. This is done to ensure the safety of the occupants of the associated vehicle, as well as others who may collide with the vehicle.

The vehicle control subsystem 660 may include such components as a cruise control subsystem, a forward collision warning (FCW) subsystem, lane departure warning (LDW) subsystem, blind spot detection (BSD) warning subsystem, adaptive cruise control (ACC) subsystem, lane keep assist (LKA) subsystem, ACC with lane keeping subsystem, traffic jam assist subsystem, full highway autopilot subsystem, full urban autopilot subsystem, robo-taxi/shuttle subsystem, autonomous delivery fleet subsystem, or other.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a serial clock routing pipeline comprising a set of cascaded clock routing stages including a first set of clock inputs, respectively, and a clock output;
   a first set of clock generators including a first set of clock outputs coupled to the first set of clock inputs of the serial clock routing pipeline, respectively;
   a first clock monitoring unit including a first clock input coupled to the clock output of the serial clock routing pipeline, and a first status output to provide information concerning one or more of the first set of clock generators; and
   a set of data processing cores coupled to the first set of clock outputs of the set of clock generators, respectively.

2. The apparatus of claim 1, wherein the set of cascaded clock routing stages comprises a set of multiplexers, respectively, wherein the set of multiplexers comprises:
   the first set of clock inputs of the serial clock routing pipeline, respectively;
   a set of multiplexer select inputs coupled to a set of clock select outputs of the first clock monitoring unit, respectively; and
   a set of clock outputs coupled to at least one other clock input of a following one of the set of multiplexers and the first clock input of the first clock monitoring unit, respectively.

3. The apparatus of claim 2, further comprising a second set of clock generators including a second set of clock outputs coupled to a second set of clock inputs of the set of multiplexers, respectively.

4. The apparatus of claim 1, wherein the set of cascaded clock routing stages comprises a set of clock dividers, respectively, wherein the set of clock dividers comprises:
   a second set of clock inputs coupled to the first set of clock inputs, respectively;
   a set of clock divider value inputs coupled to a set of clock divider value outputs of the first clock monitoring unit, respectively; and
   a set of clock outputs coupled to at least one other clock input of a following one of the set of clock dividers and the first clock input of the first clock monitoring unit, respectively.

5. The apparatus of claim 1, wherein the set of cascaded clock routing stages comprises a set of clock gating circuits, respectively, wherein the set of clock gating circuits comprises:
   a second set of clock inputs coupled to the first set of clock inputs, respectively;
   a set of clock gating enable inputs coupled to a set of clock gating enable outputs of the first clock monitoring unit, respectively; and
   a set of clock outputs coupled to at least one other clock input of a following one of the set of clock dividers and the first clock input of the first clock monitoring unit, respectively.

6. The apparatus of claim 1, further comprising a set of phase locked loops (PLLs) including a second set of clock outputs coupled to a second set of clock inputs of the set of clock generators, respectively.

7. The apparatus of claim 6, wherein the set of PLLs comprises a set of PLL lock detect signal outputs coupled to a set of PLL lock detect signal inputs of the first clock monitoring unit, respectively.

8. The apparatus of claim 7, wherein the set of PLLs comprises a set of PLL status signal outputs coupled to a set of PLL status signal inputs of the first clock monitoring unit, respectively.

9. The apparatus of claim 8, further comprising a PLL fault detector coupled to the set of PLL lock detect inputs and the set of PLL status signal inputs, and coupled to the first status output to provide the information concerning one or more of the set of PLLs being out-of-lock.

10. The apparatus of claim 9, wherein the PLL fault detector includes a PLL mask input to receive a PLL mask signal indicating which one or more of a set of lock detect signals received from the set of PLL status signal inputs to ignore, respectively.

11. The apparatus of claim 1, wherein the first clock monitoring unit comprises a frequency measurement unit including the first clock input of the first clock monitoring unit, and a frequency measurement output to generate information concerning a frequency of a clock generated by a selected one of the set of clock generators.

12. The apparatus of claim 11, wherein the frequency measurement unit comprises:
   a first counter comprising:
      the first clock input of the first clock monitoring unit;
      a reset input;
      a first start input;
      a stop input; and
      the frequency measurement output; and
   a second counter comprising:
      a second clock input to receive a reference clock;
      a second start input;
      a count limit input; and
      a stop output coupled to the stop input of the first counter.

13. The apparatus of claim 12, wherein the first clock monitoring unit further comprises a control unit including a control output coupled to the reset input, the first start input, the second start input, and the count limit input.

14. The apparatus of claim 13, wherein the control unit comprises a finite state machine (FSM).

15. The apparatus of claim 1, wherein the first status output of the first clock monitoring unit comprises a clock fault interrupt output to provide the information concerning one or more frequencies of one or more clocks generated by the one or more of the first set of clock generators being out-of-specification, respectively.

16. The apparatus of claim 1, wherein the first clock monitoring unit further comprises a timer including a measurement time limit input to receive a measurement time limit signal indicating a measurement time limit by which to complete frequency measurement of one or more clocks generated by a selected one or more of the set of clock generators, respectively.

17. The apparatus of claim 16, wherein the first status output of the first clock monitoring unit comprises a timer fault interrupt output to provide the information concerning whether the frequency measurement was completed within the measurement time.

18. The apparatus of claim 1, further comprising a second set of clock generators including a second set of clock outputs coupled to a set of clock inputs of the first clock monitoring unit, wherein the information concerning one or more of the first set of clock generators is based on one or more of the second set of clock generators.

19. The apparatus of claim 18, wherein the first status output is to provide information concerning one or more of the second set of clock generators.

20. The apparatus of claim 19, wherein the information concerning one or more of the second set of clock generators is based on a frequency of one of the second set of clock generators and a frequency of another of the second set of clock generators.

21. The apparatus of claim 1, further comprising:
a second clock monitoring unit including a second clock input coupled to the clock output of the serial clock routing pipeline, and a second status output to provide information concerning one or more of the first set of clock generators;
a second set of clock generators including a second set of clock outputs, respectively; and
a third clock monitoring unit including a second set of clock inputs coupled to the second set of clock outputs of the second set of clock generators, respectively, and a second status output to provide information concerning one or more of the second set of clock generators.

22. An apparatus, comprising:
a set of clock generators configured to generate a set of clocks, respectively;
a clock monitoring unit configured to process the set of clocks, respectively;
a serial clock routing pipeline comprising a set of cascaded clock routing stages coupled to the set of clock generators, respectively, wherein the serial clock routing pipeline is configured to route a selected one of the set of clocks to the clock monitoring unit by way of one or more of the set of cascaded clock routing stages; and
a set of data processing cores coupled to the set of clock generators, respectively.

23. The apparatus of claim 22, further comprising a set of phase locked loops (PLLs) configured to generate a set of base clocks, wherein the set of clock generators are configured to generate the set of clocks based on the set of base clocks, respectively, wherein the set of PLLs are configured to generate a set of out-of-lock indication signals, and wherein the clock monitoring unit is configured to report whether one or more of the set of PLLs are out-of-lock based on one or more of the set of out-of-lock indication signals, respectively.

24. The apparatus of claim 23, wherein the set of PLLs are configured to generate a set of status signals indicative of whether the set of out-of-lock indication signals are valid, respectively, wherein the clock monitoring unit is configured to report whether one or more of the set of PLLs are out-of-lock based on the one or more of the set of status signals, respectively.

25. The apparatus of claim 22, further comprising a set of reference clock generators configured to generate a set of reference clocks, wherein the clock monitoring unit configured to determine whether one or more frequencies of the set of reference clocks are within specification.

26. A method, comprising:
generating a set of clocks;
providing the set of clocks to a set of inputs of a set of cascaded routing stages, respectively;
routing a selected one of the set of clocks for frequency measurement purpose via one or more of the set of cascaded clock routing stages of a serial clock routing pipeline;
determining the frequency of the selected clock after the selected clock has been routed through the serial clock routing pipeline; and
processing data by a set of data processing cores based on the set of clocks, respectively.

27. The method of claim 26, further comprising:
performing a set of phase lock loop (PLL) operations to generate the set of clocks, respectively;
generating a set of out-of-lock indication signals indicative of whether the set of PLL operations are locked, respectively; and
reporting whether one or more of the set of PLL operations are out-of-lock based on the one or more of the set of out-of-lock indication signals, respectively.

28. The method of claim 27, further comprising generating a set of status signals indicative of whether the set of out-of-lock indication signals are valid, respectively, wherein reporting whether one or more of the set of PLL operations are out-of-lock based on the one or more of the set of status signals, respectively.

29. The method of claim 26, further comprising:
generating a set of reference clocks, wherein determining the frequency of the selected clock is based on a selected on of the set of reference clocks; and
determining a frequency of a selected one of the set of reference clocks based on another one of the set of reference clocks.

30. A vehicle system, comprising:
a vehicle control subsystem;
a set of one or more digital signal processing cores coupled to the vehicle control subsystem;
a serial clock routing pipeline comprising a set of cascaded clock routing stages including a set of clock inputs, respectively, and a clock output;
a set of clock generators including a set of clock outputs coupled to the first set of clock inputs of the serial clock routing pipeline, respectively, wherein the set of clock generators are coupled to the set of one or more digital signal processing cores; and
a clock monitoring unit including a first clock input coupled to the clock output of the serial clock routing pipeline, and a first status output to provide information concerning one or more of the first set of clock generators.

31. The vehicle system of claim 30, further comprising a set of phase locked loops (PLLs) coupled to the set of clock generators, respectively, wherein the set of PLLs are coupled to the clock monitoring unit.

* * * * *